(12) United States Patent
Lee et al.

(10) Patent No.: US 10,636,460 B2
(45) Date of Patent: Apr. 28, 2020

(54) SEMICONDUCTOR SYSTEM INCLUDING MODE REGISTER CONTROL CIRCUIT

(71) Applicant: SK hynix Inc., Icheon-si, Gyeonggi-do (KR)

(72) Inventors: Seung Hun Lee, Icheon-si (KR); Won Kyung Chung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/144,298

(22) Filed: Sep. 27, 2018

(65) Prior Publication Data

US 2019/0341087 A1   Nov. 7, 2019

(30) Foreign Application Priority Data

May 2, 2018 (KR) .................. 10-2018-0050761

(51) Int. Cl.
*G11C 7/10* (2006.01)
*G11C 7/22* (2006.01)

(52) U.S. Cl.
CPC .......... *G11C 7/1072* (2013.01); *G11C 7/1045* (2013.01); *G11C 7/1057* (2013.01); *G11C 7/22* (2013.01)

(58) Field of Classification Search
CPC ... G11C 7/1072; G11C 7/1045; G11C 7/1057; G11C 7/22
See application file for complete search history.

(56) References Cited

U.S. PATENT DOCUMENTS

| | | | | |
|---|---|---|---|---|
| 8,429,470 B2* | 4/2013 | Shore | ................ | G11C 29/883 714/719 |
| 8,832,391 B2* | 9/2014 | Choi | ................ | G06F 13/1668 711/105 |
| 9,087,592 B2* | 7/2015 | Sohn | ................ | G11C 11/1675 |
| 9,734,878 B1 | 8/2017 | Aquil et al. | | |
| 2011/0208883 A1* | 8/2011 | Moon | ................ | G11C 7/1006 710/74 |
| 2013/0339641 A1* | 12/2013 | Ok | ................ | G06F 12/0646 711/158 |
| 2016/0179377 A1* | 6/2016 | Yoon | ................ | G06F 3/061 711/154 |

FOREIGN PATENT DOCUMENTS

KR   1020150042360 A   4/2015

\* cited by examiner

*Primary Examiner* — Tri M Hoang
(74) *Attorney, Agent, or Firm* — William Park & Associates Ltd.

(57) ABSTRACT

A mode register control circuit may include a masking signal generation circuit and a storage control pulse generation circuit. The masking signal generation circuit may be configured to generate a masking signal from data. The storage control pulse generation circuit may be configured to generate a storage control pulse for controlling a mode register write operation, from a mode register write pulse in response to the masking signal.

20 Claims, 12 Drawing Sheets

14

US 10,636,460 B2

SEMICONDUCTOR SYSTEM INCLUDING MODE REGISTER CONTROL CIRCUIT

CROSS-REFERENCE TO RELATED APPLICATION

The present application claims priority under 35 U.S.C. § 119(a) to Korean Patent Application No. 10-2018-0050761 filed on May 2, 2018 in the Korean Intellectual Property Office, which is incorporated herein by reference in its entirety.

BACKGROUND

1. Technical Field

Embodiments of the present disclosure generally relate to a mode register control circuit, and more particularly, a mode register control circuit and a semiconductor system including a mode register control circuit.

2. Related Art

A semiconductor device includes a mode register to operate in various operation modes. Information on a latency, a burst length, and so forth are stored in the mode register. The semiconductor device may perform a data input/output operation by using information on an operation mode which is stored in the mode register.

SUMMARY

In an embodiment, a mode register control circuit may include a masking generation circuit and a storage control pulse generation circuit. The masking signal generation circuit may be configured to generate a masking signal from data. The storage control pulse generation circuit may be configured to generate a storage control pulse for controlling a mode register write operation, from a mode register write pulse in response to the masking signal.

In an embodiment, a semiconductor system may include a controller and a semiconductor device. The controller may be configured to output data through a data bus, and output a command address through a command address bus. The semiconductor device may be configured to generate a masking signal from the data inputted through the data bus. The semiconductor device may be configured to generate a storage control pulse for controlling a mode register write operation, from a mode register write pulse in response to the masking signal.

In an embodiment, a mode register control circuit may include a masking signal generation circuit, a first storage control pulse generation circuit, and a second storage control pulse generation circuit. The masking signal generation circuit may be configured to generate a first masking signal from first data, and generate a second masking signal from second data. The first storage control pulse generation circuit may be configured to generate a first storage control pulse for controlling a mode register write operation, from a mode register write pulse in response to the first and second masking signals. The second storage control pulse generation circuit may be configured to generate a second storage control pulse for controlling a mode register write operation, from the mode register write pulse in response to the first and second masking signals.

In an embodiment, a mode register control circuit may include a storage control pulse generation circuit. The storage control pulse generation circuit may be configured to generate a storage control pulse for controlling a mode register write operation, from a mode register write pulse in response to a masking signal. The masking signal is based on data received by the mode register control circuit.

Figure 1:
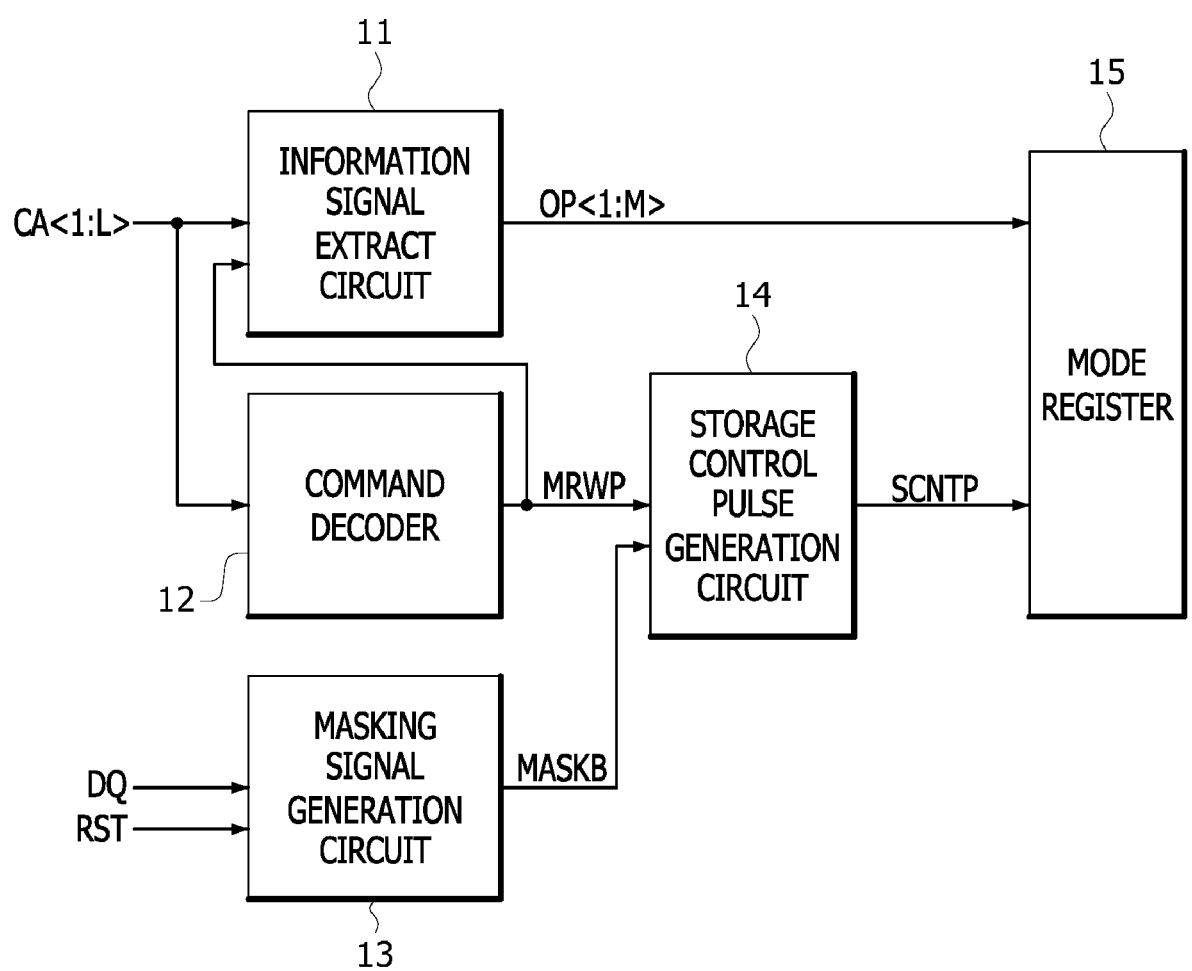
FIG. 1 is a block diagram illustrating an example configuration of a mode register control circuit in accordance with an embodiment.

FIG, 3 is a circuit diagram illustrating an example of the storage control pulse generation circuit included in the mode register control circuit illustrated in FIG. 1 in accordance with an embodiment.

Figure 4:
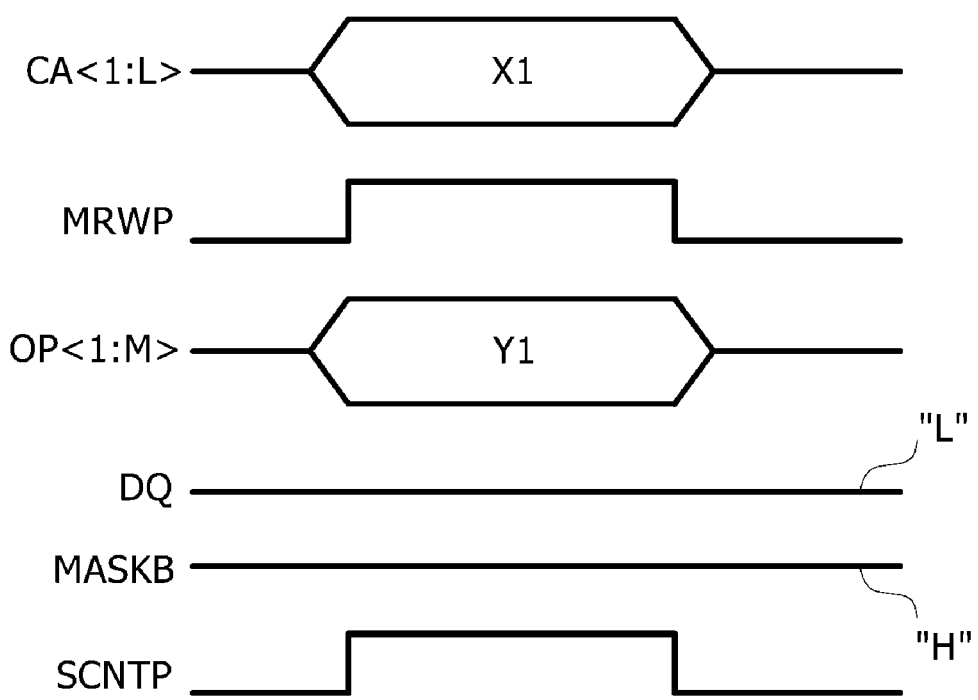
Figure 5:
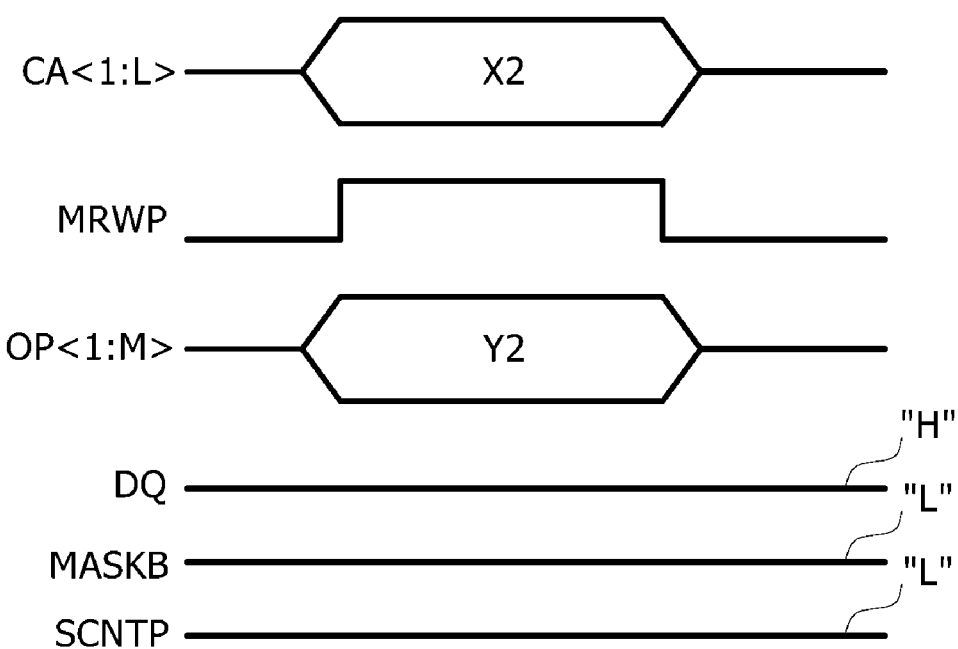

FIGS. 4 and 5 are examples of timing diagrams to assist in the explanation of the operation of the mode register control circuit illustrated in FIG. 1 in accordance with an embodiment.

Figure 6:
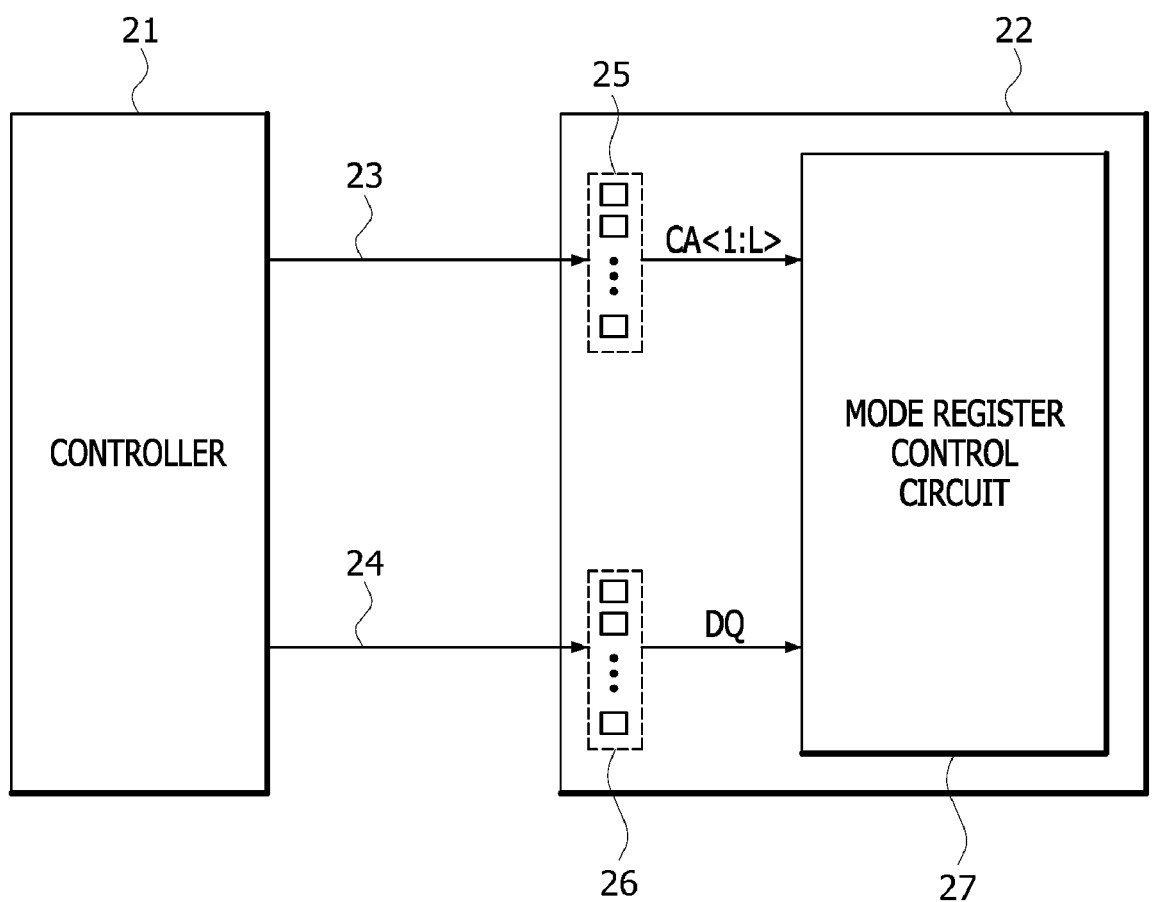

FIG. 6 is a block diagram illustrating an example of the configuration of a semiconductor system to which the mode register control circuit illustrated in FIGS. 1 to 5 is applied in accordance with an embodiment.

Figure 7:
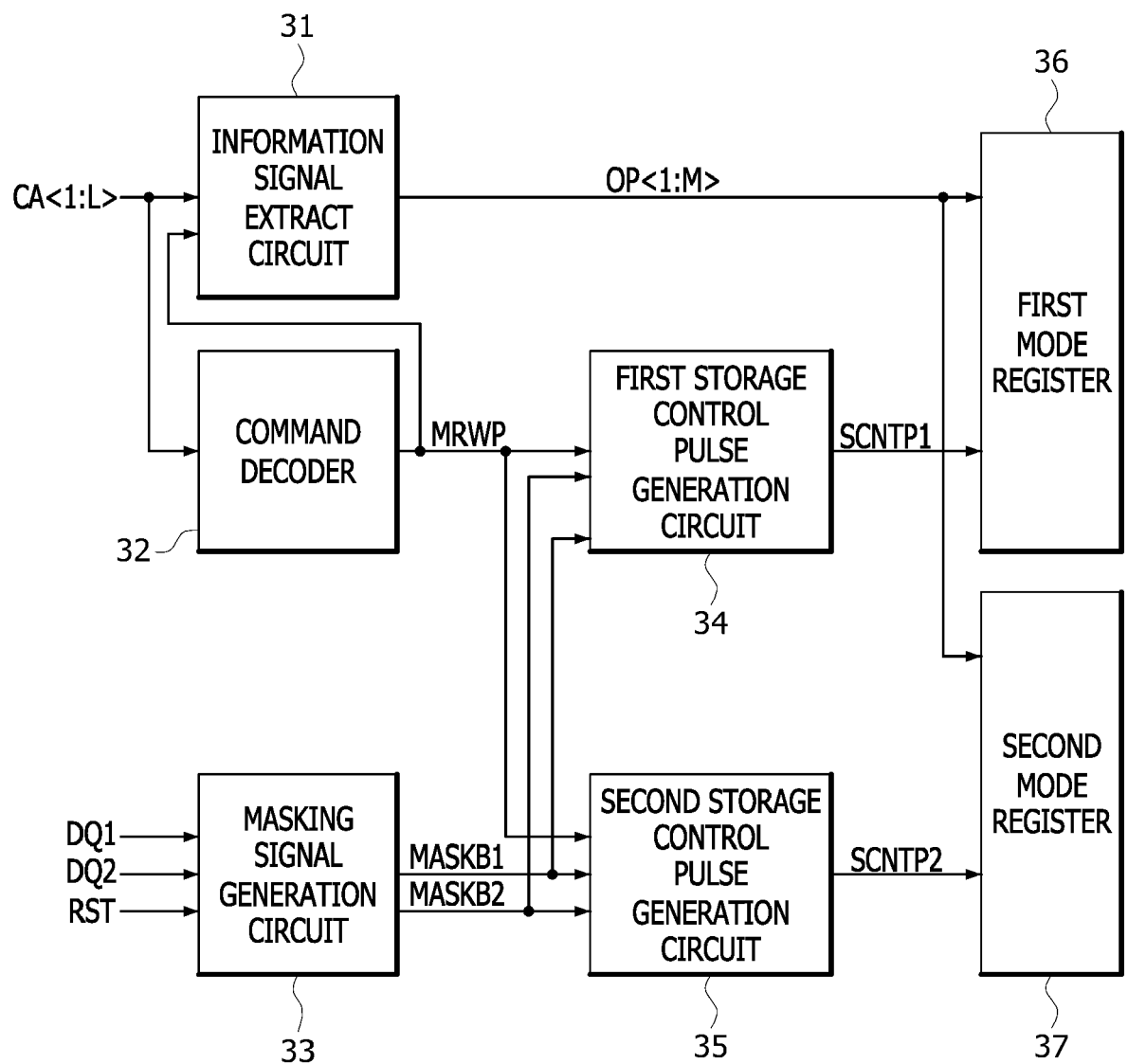

FIG. 7 is a block diagram illustrating an example of the configuration of a mode register control circuit in accordance with an embodiment.

Figure 8:
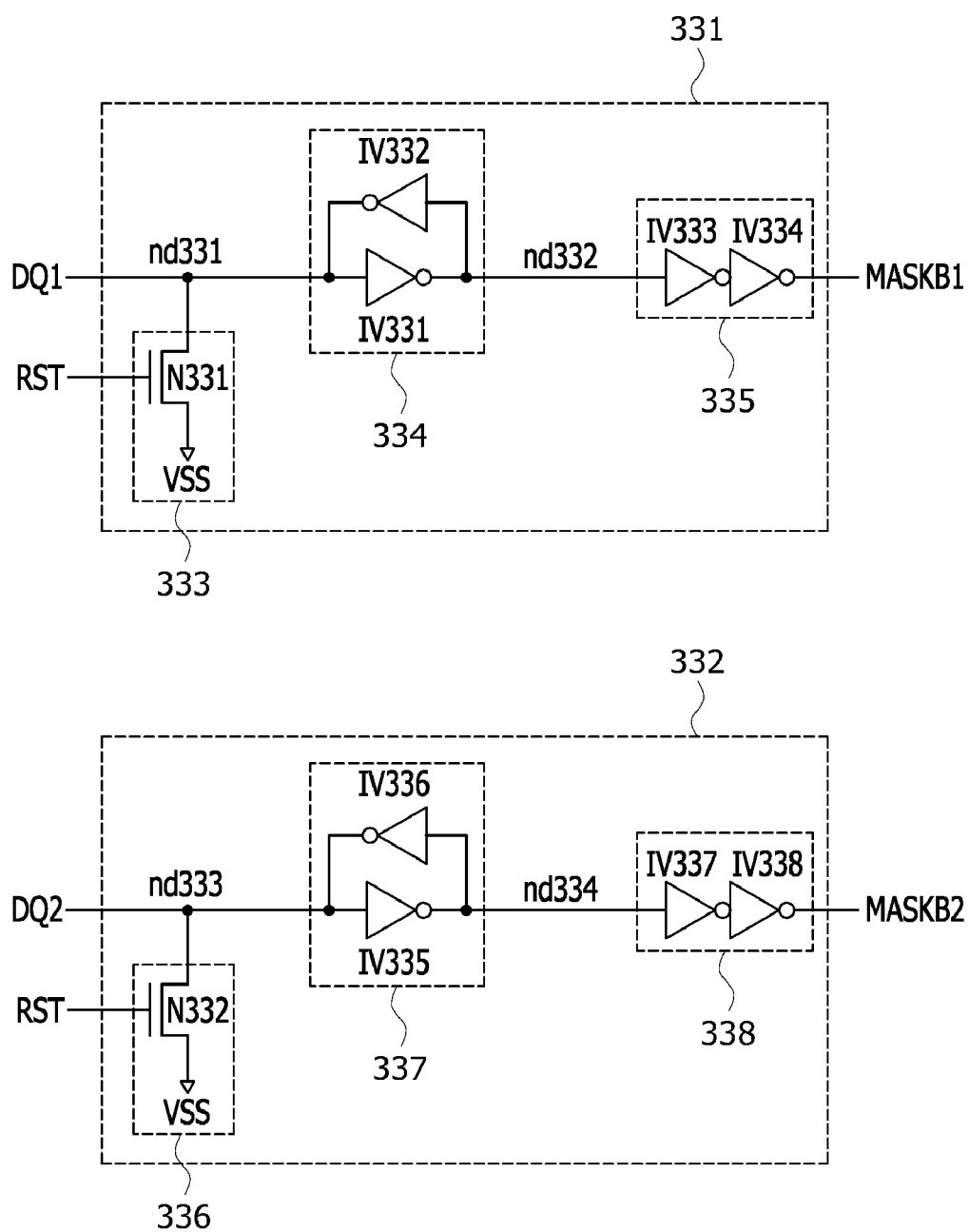

FIG. 8 is a circuit diagram illustrating an example of the masking signal generation circuit included in the mode register control circuit illustrated in FIG. 7 in accordance with an embodiment.

Figure 9:
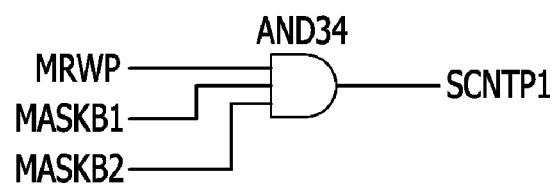

FIG. 9 is a circuit diagram illustrating an example of the first storage control pulse generation circuit included in the mode register control circuit illustrated in FIG. 7 in accordance with an embodiment.

Figure 10:
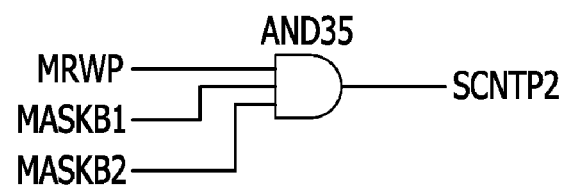

FIG. 10 is a circuit diagram illustrating an example of the second storage control pulse generation circuit included in the mode register control circuit illustrated in FIG. 7 in accordance with an embodiment.

Figure 11:
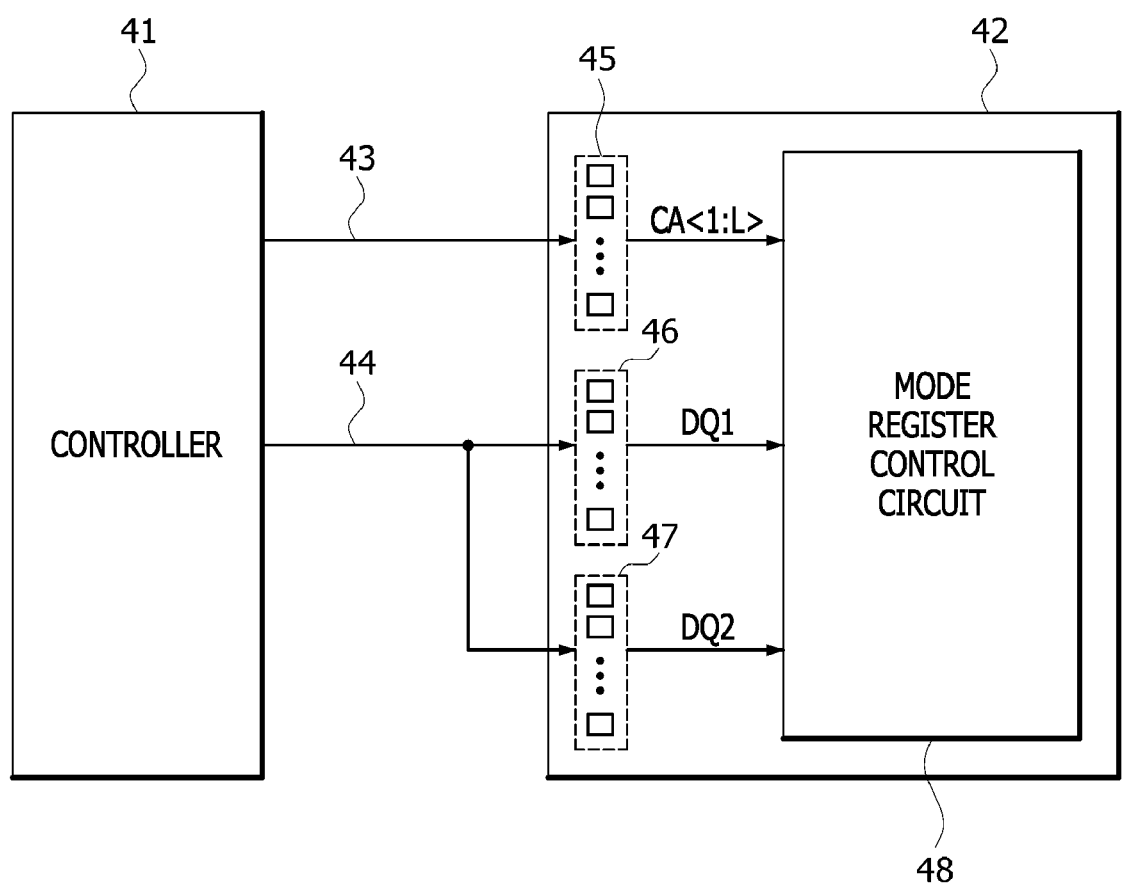

FIG. 11 is a block diagram illustrating an example of the configuration of a semiconductor system to which the mode register control circuit illustrated in FIGS. 7 to 10 is applied in accordance with an embodiment.

Figure 12:
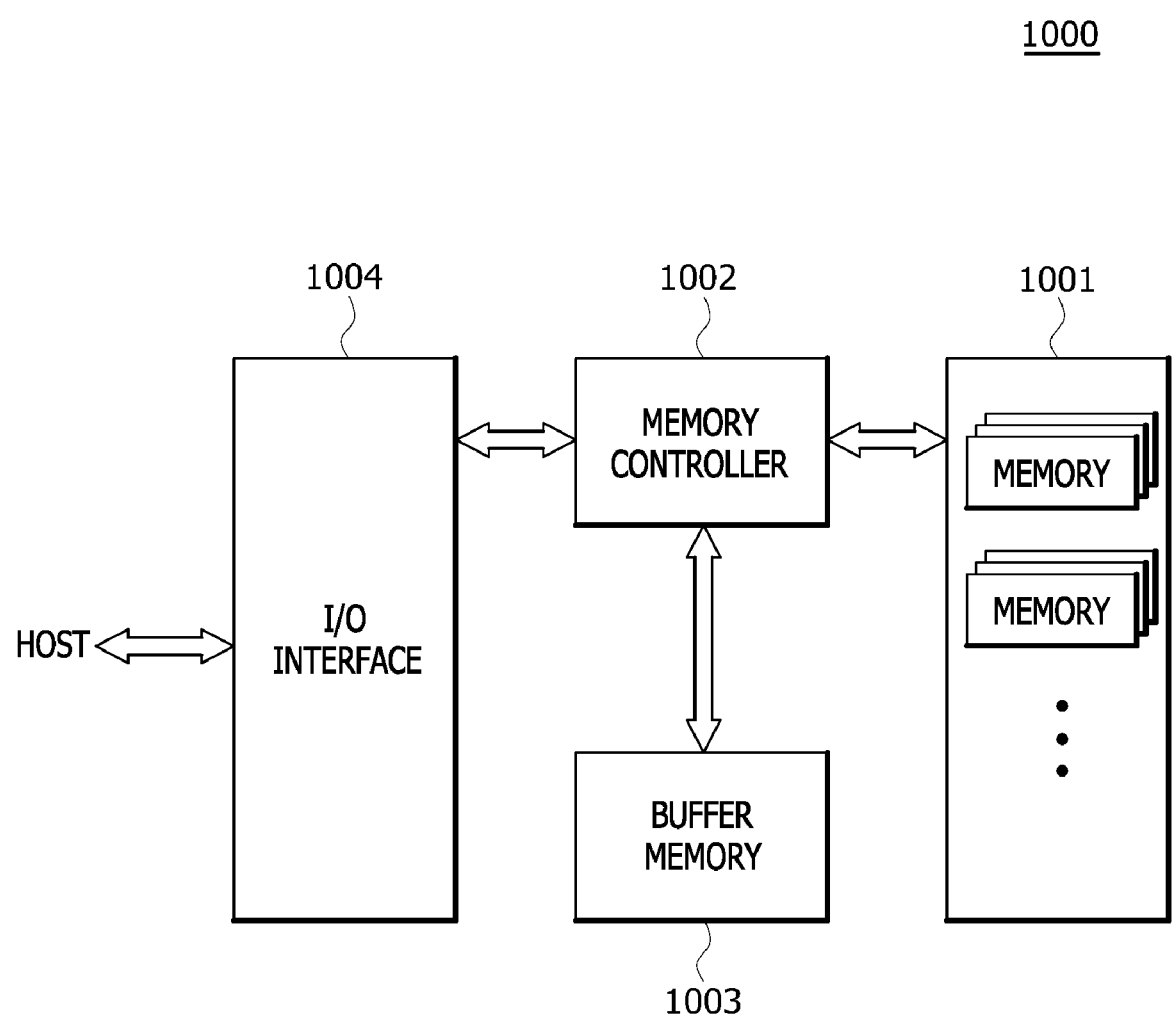

FIG. 12 is a diagram illustrating an example of the configuration of an electronic system to which each of the semiconductor systems illustrated in FIGS. 6 and 11 is applied in accordance with an embodiment.

DETAILED DESCRIPTION

Hereinafter, a semiconductor system including a mode register control circuit will be described below with reference to the accompanying drawings through various examples of embodiments.

Various embodiments are directed to a semiconductor system including a mode register control circuit that may be capable of controlling a mode register write operation.

According to various embodiments, by generating a masking signal through using data and controlling whether to perform a mode register write operation, through using the masking signal, it may be possible to easily adjust a performance timing of the mode register write operation.

Also, according to various embodiments, in a semiconductor system including a plurality of semiconductor devices, it may be possible to adjust a performance timing of a mode register write operation in each of the semiconductor devices included in the semiconductor system.

As illustrated in FIG. 1, a mode register control circuit 1 in accordance with an embodiment may include an information signal extract circuit 11, a command decoder 12, a masking signal generation circuit 13, a storage control pulse generation circuit 14, and a mode register 15.

The information signal extract circuit 11 may extract an information signal OP<1:M> from a command address CA<1:L> in the case where a mode register write pulse MRWP is generated. A method of extracting the information signal OP<1:M> from the command address CA<1:L> in the information signal extract circuit 11 may be varied depending on an embodiment. For example, the information signal extract circuit 11 may select and output some bits included in the command address CA<1:L>, as the information signal OP<1:M>, when the mode register write pulse MRWP is generated. The information signal OP<1:M> may include information on a latency or a burst length used in a data input/output operation. The number L of the bits included in the command address CA<1:L> and the number M of the bits included in the information signal OP<1:M> may be set variously depending on an embodiment. The number L of the bits included in the command address CA<1:L> may be set to be larger than the number M of the bits included in the information signal OP<1:M>.

The command decoder 12 may decode the command address CA<1:L> and generate the mode register write pulse MRWP. The command decoder 12 may generate the mode register write pulse MRWP in the case where some bits included in the command address CA<1:L> have a preset logic level combination. The mode register write pulse MRWP may be generated to perform a mode register write operation of storing the information signal OP<1:M> in the mode register 15.

The masking signal generation circuit 13 may generate a masking signal MASKB in response to data DQ and a reset signal RST. The masking signal generation circuit 13 may initialize the masking signal MASKB to a disabled state in the case where the reset signal RST is enabled. The reset signal RST may be enabled for the initialization operation. The masking signal generation circuit 13 may generate the masking signal MASKB which is enabled, in the case where the data DQ has a preset logic level. The detailed configuration and operation of the masking signal generation circuit 13 will be described later with reference to FIG. 2.

The storage control pulse generation circuit 14 may generate a storage control pulse SCNTP in response to the mode register write pulse MRWP and the masking signal MASKB. The storage control pulse generation circuit 14 may generate the storage control pulse SCNTP in the case where the mode register write pulse MRWP is generated with the masking signal MASKB disabled. The storage control pulse generation circuit 14 may block the generation of the storage control pulse SCNTP in the case where the masking signal MASKB is enabled. The detailed configuration and operation of the storage control pulse generation circuit 14 will be described later with reference to FIG. 3.

The mode register 15 may store the information signal OP<1:M> in the case where the storage control pulse SCNTP is generated. The information signal OP<1:M> stored in the mode register 15 is used in setting information on a latency or a burst length.

Figure 2:
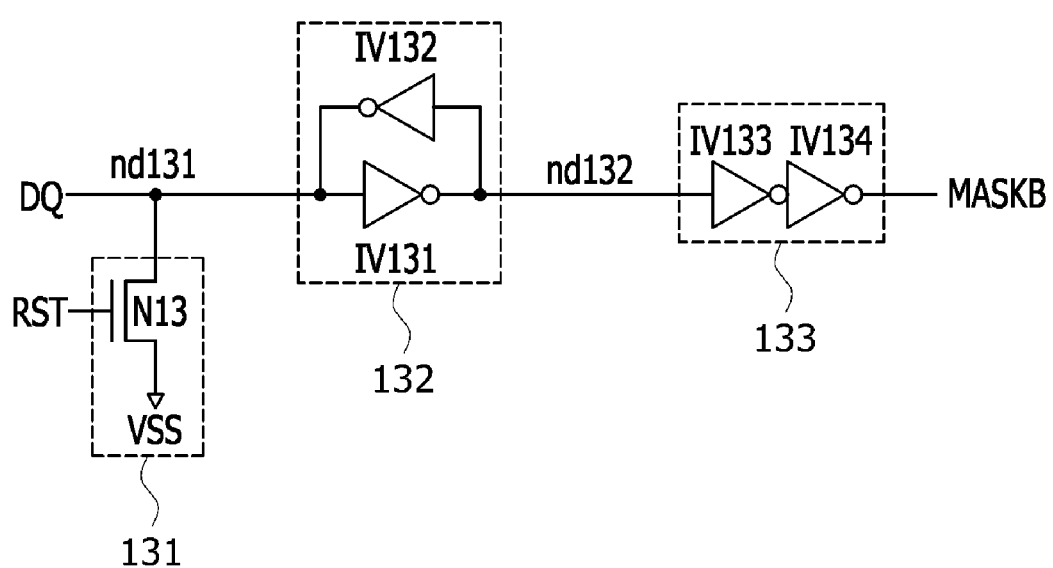
FIG. 2 is a circuit diagram illustrating an example of the masking signal generation circuit included in the mode register control circuit illustrated in FIG. 1 in accordance with an embodiment.

Referring to FIG. 2, the masking signal generation circuit 13 may include an initialization circuit 131, a latch circuit 132, and a buffer circuit 133.

The initialization circuit 131 may include a transistor, for example but not limited to, an NMOS transistor N13. The NMOS transistor N13 may be coupled between a node nd131 and a ground voltage VSS, and may be turned on in response to the reset signal RST. The initialization circuit 131 may initialize the node nd131 to a logic low level in the case where the reset signal RST is enabled to a logic high level in the initialization operation. The latch circuit 132 may perform inversion operations and latching operations. The latch circuit 132 may include, for example but not limited to, inverters IV131 and IV132. The inverter IV131 may invert and buffer the signal of the node nd131, and output an output signal to a node nd132. The inverter IV132 may invert and buffer the signal of the node nd132, and output an output signal to the node nd131. The latch circuit 132 may latch the signals of the nodes nd131 and nd132. The buffer circuit 133 may perform a buffering operation. The buffer circuit 133 may include, for example but not limited to, inverters IV133 and IV134. The buffer circuit 133 may buffer the signal of the node nd132, and may output the masking signal MASKB.

The masking signal generation circuit 13 may initialize the masking signal MASKB to a state in which it is disabled to a logic high level, in the case where the reset signal RST is enabled to the logic high level. While, in the present embodiment, the reset signal RST is set to be enabled to the logic high level, it is to be noted that, depending on an embodiment, the reset signal RST may be set to be enabled to a logic low level. While, in the present embodiment, the masking signal MASKB is set to be enabled to a logic low level, it is to be noted that, depending on an embodiment, the masking signal MASKB may be set to be enabled to the logic high level. The masking signal generation circuit 13 may generate the masking signal MASKB which is enabled to the logic low level, in the case where the data DQ has a logic high level.

Figure 3:
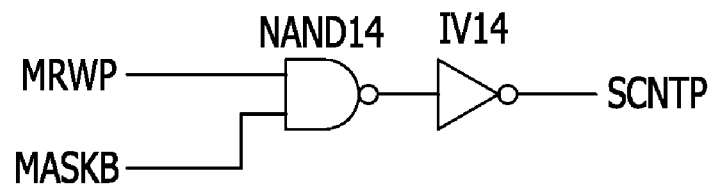

Referring to FIG. 3, the storage control pulse generation circuit 14 may perform a NAND operation, inversion operation, and buffering operation. The storage control pulse generation circuit 14 may include, for example, a NAND gate NAND14 and an inverter IV14. The NAND gate NAND14 may receive the mode register write pulse MRWP and the masking signal MASKB, and may perform a NAND logic operation. The inverter IV14 may invert and buffer the output signal of the NAND gate NAND14, and output an output signal. That is, for example, the storage control pulse generation 14 may buffer the mode register write pulse MRWP when the masking signal MASKB is disabled, and output the storage control pulse SCNTP.

The storage control pulse generation circuit 14 may generate the storage control pulse SCNTP to a logic high level in the case where the mode register write pulse MRWP is generated to a logic high level with the masking signal MASKB disabled to the logic high level. The storage control pulse generation circuit 14 may block the generation of the storage control pulse SCNTP in the case where the masking signal MASKB is enabled to the logic low level.

The operation of the mode register control circuit 1 configured as mentioned above will be described below by being divided into a to case where a mode register write operation is performed by the masking signal MASKB and a case where a mode register write operation is blocked by the masking signal MASKB.

As illustrated in FIG. 4, in the case where the logic level combination of the command address CA<1:L> is inputted as 'X1', the mode register write pulse MRWP may be generated, and the logic level combination of the information signal OP<1:M> may be extracted as 'Y1' In the case where the data DQ is a logic low level, since the masking signal MASKB is in a state in which it is disabled to the logic high level, the storage control pulse SCNTP may be generated when the mode register write pulse MRWP is generated, and thus, a mode register write operation in which the information signal OP<1:M> is stored in the mode register 15 may be performed.

As illustrated in FIG. 5, in the case where the logic level combination of the command address CA<1:L> is inputted as 'X2,' the mode register write pulse MRWP may be generated, and the logic level combination of the information signal OP<1:M> may be extracted as 'Y2.' In the case where the data DQ is the logic high level, since the masking signal MASKB is in a state in which it is enabled to the logic low level, the generation of the storage control pulse SCNTP may be blocked (e.g., storage control pulse SCNTP at a logic low level), and thus, a mode register write operation may be blocked from being performed.

The mode register control circuit 1 described above with reference to FIGS. 1 to 5 may be applied to a semiconductor system. For example, referring to FIG. 6, a semiconductor system 2 may include a controller 21 and a semiconductor device 22.

The controller 21 may be coupled to the semiconductor device 22 through a command address bus 23 and a data bus 24. The controller 21 may apply a command address CA<1:L> to the semiconductor device 22 through the command address bus 23. The controller 21 may apply data DQ to the semiconductor device 22 through the data bus 24.

The semiconductor device 22 may include a first pad part 25, a second pad part 26, and a mode register control circuit 27. Each of the first pad part 25 and the second pad part 26 may include a plurality of pads. The semiconductor device 22 may be applied with the command address CA<1:L> through the first pad part 25 from the controller 21. The semiconductor device 22 may be applied with the data DQ through the second pad part 26 from the controller 21. The mode register control circuit 27 may receive the command address CA<1:L> and the data DQ, and may control a mode register write operation, Since the configuration and operation of the mode register control circuit 27 are described above with reference to FIGS. 1 to 5, detailed descriptions thereof will be omitted herein, The mode register control circuit 1 in accordance with an embodiment configured as mentioned above may generate the masking signal MASKB by using the data DQ, and may block the storage control pulse SCNTP from being generated from the mode register write pulse MRWP in the case where the masking signal MASKB is enabled. In the case where the generation of the storage control pulse SCNTP is blocked, a mode register write operation in which the information signal OP<1:M> is stored in the mode register 15 might not be performed. That is to say, in a semiconductor device in accordance with an embodiment, when the mode register write pulse MRWP is generated to perform a mode register write operation, it may be possible to easily control whether to perform the mode register write operation by the data DQ. In the case where a semiconductor system to which the mode register control circuit 1 in accordance with an embodiment is applied includes a plurality of semiconductor devices, it may be possible to control whether to perform a mode register write operation in each of the semiconductor devices depending on data, whereby the mode register write operation may be performed at an optimal timing in each semiconductor device.

As illustrated in FIG. 7, a mode register control circuit 3 in accordance with an embodiment may include an information signal extract circuit 31, a command decoder 32, a masking signal generation circuit 33, a first storage control pulse generation circuit 34, a second storage control pulse generation circuit 35, a first mode register 36, and a second mode register 37.

The information signal extract circuit 31 may extract an information signal OP<1:M> from a command address CA<1:L> in the case where a mode register write pulse MRWP is generated. A method of extracting the information signal OP<1:M> from the command address CA<1:L> in the information signal extract circuit 31 may be varied depending on an embodiment. For example, the information signal extract circuit 31 may select and output some bits included in the command address CA<1:L>, as the information signal OP<1:M>, when the mode register write pulse MRWP is generated. The information signal OP<1:M> may include information on a latency or a burst length used in a data input/output operation. The number L of the bits included in the command address CA<1:L> and the number M of the bits included in the information signal OP<1:M> may be set variously depending on an embodiment. The number L of the bits included in the command address CA<1:L> may be set to be larger than the number M of the bits included in the information signal OP<1:M>.

The command decoder 32 may decode the command address CA<1:L> and generate the mode register write pulse MRWP. The command decoder 32 may generate the mode register write pulse MRWP in the case where some bits included in the command address CA<1:L> have a preset logic level combination. The mode register write pulse MRWP may be generated to perform a mode register write operation of storing the information signal OP<1:M> in the first mode register 36 and the second mode register 37.

The masking signal generation circuit 33 may generate a first masking signal MASKB1 and a second masking signal MASKB2 in response to first data DQ1, second data DQ2, and a reset signal RST. The masking signal generation circuit 33 may initialize the first masking signal MASKB1 and the second masking signal MASKB2 to a disabled state in the case where the reset signal RST is enabled. The reset signal RST may be enabled for the initialization operation. The masking signal generation circuit 33 may generate the first masking signal MASKB1 which is enabled, in the case where the first data DQ1 has a preset logic level. The masking signal generation circuit 33 may generate the second masking signal MASKB2 which is enabled, in the case where the second data DQ2 has a preset logic level. The detailed configuration and operation of the masking signal generation circuit 33 will be described later with reference to FIG. 8.

The first storage control pulse generation circuit 34 may generate a first storage control pulse SCNTP1 in response to the mode register write pulse MRWP, the first masking signal MASKB1, and the second masking signal MASKB2. The first storage control pulse generation circuit 34 may generate the first storage control pulse SCNTP1 in the case where the mode register write pulse MRWP is generated with the first masking signal MASKB1 and the second masking signal MASKB2 disabled. The first storage control pulse generation circuit 34 may block the generation of the first storage control pulse SCNTP1 in the case where the first masking signal MASKB1 or the second masking signal MASKB2 is enabled. The detailed configuration and operation of the first storage control pulse generation circuit 34 will be described later with reference to FIG. 9.

The second storage control pulse generation circuit 35 may generate a second storage control pulse SCNTP2 in response to the mode register write pulse MRWP, the first masking signal MASKB1, and the second masking signal MASKB2. The second storage control pulse generation circuit 35 may generate the second storage control pulse SCNTP2 in the case where the mode register write pulse MRWP is generated with the first masking signal MASKB1 and the second masking signal MASKB2 disabled. The second storage control pulse generation circuit 35 may block the generation of the second storage control pulse SCNTP2 in the case where the first masking signal MASKB1 or the second masking signal MASKB2 is enabled. The detailed configuration and operation of the second storage control pulse generation circuit 35 will be described later with reference to FIG. 10.

The first mode register 36 may store the information signal OP<1:M> in the case where the first storage control pulse SCNTP1 is generated. The information signal OP<1:M> stored in the first mode register 36 may be used in setting information on a latency or a burst length.

The second mode register 37 may store the information signal OP<1:M> in the case where the second storage control pulse SCNTP2 is generated. The information signal OP<1:M> stored in the second mode register 37 may be used in setting information on a latency or a burst length. The second mode register 37 may store information different from that of the first mode register 36.

Referring to FIG. 8, the masking signal generation circuit 33 may include a first masking signal generation circuit 331 and a second masking signal generation circuit 332.

The first masking signal generation circuit 331 may include a first initialization circuit 333, a first latch circuit 334, and a first buffer circuit 335. The first initialization circuit 333 may include a transistor, for example but not limited to, an NMOS transistor N331. The NMOS transistor N331 may be coupled between a node nd331 and a ground voltage VSS, and may be turned on in response to the reset signal RST. The first initialization circuit 333 may initialize the node nd331 to a logic low level in the case where the reset signal RST is enabled to a logic high level in the initialization operation, The first latch circuit 334 may perform inversion operations and latching operations, The first latch circuit 334 may include, for example but not limited to, inverters IV331 and IV332. The inverter IV331 may invert and buffer the signal of the node nd331, and output an output signal to a node nd332. The inverter IV332 may invert and buffer the signal of the node nd332, and output an output signal to the node nd331. The first latch circuit 334 may latch the signals of the nodes nd331 and nd332. The first buffer circuit 335 may perform a buffering operation. The first buffer circuit 335 may include, for example but not limited to, inverters IV333 and IV334. The first buffer circuit 335 may buffer the signal of the node nd332, and may output the first masking signal MASKB1.

The first masking signal generation circuit 331 may initialize the first masking signal MASKB1 to a state in which it is disabled to a logic high level, in the case where the reset signal RST is enabled to the logic high level. While, in the present embodiment, the reset signal RST is set to be enabled to the logic high level, it is to be noted that, depending on an embodiment, the reset signal RST may be set to be enabled to a logic low level, While, in the present embodiment, the first masking signal MASKB1 is set to be enabled to a logic low level, it is to be noted that, depending on an embodiment, the first masking signal MASKB1 may be set to be enabled to the logic high level. The first masking signal generation circuit 331 may generate the first masking signal MASKB1 which is enabled to the logic low level, in the case where the first data DQ1 has a logic high level.

The second masking signal generation circuit 332 may include a second initialization circuit 336, a second latch circuit 337, and a second buffer circuit 338. The second initialization circuit 336 may include a transistor, for example but not limited to, an NMOS transistor N332. The NMOS transistor N332 may be coupled between a node nd333 and the ground voltage VSS, and may be turned on in response to the reset signal RST. The second initialization circuit 336 may initialize the node nd333 to a logic low level in the case where the reset signal RST is enabled to the logic high level in the initialization operation. The second latch circuit 337 may perform inversion operations and latching operations. The second latch circuit 337 may include, for example but not limited to, inverters IV335 and IV336. The inverter IV335 may invert and buffer the signal of the node nd333, and output an output signal to a node nd334. The inverter IV336 may invert and buffer the signal of the node nd334, and output an output signal to the node nd333. The second latch circuit 337 may latch the signals of the nodes nd333 and nd334. The second buffer circuit 338 may perform a buffering operation. The second buffer circuit 338 may include, for example but not limited to, inverters IV337 and IV338. The second buffer circuit 338 may buffer the signal of the node nd334, and may output the second masking signal MASKB2.

The second masking signal generation circuit 332 may initialize the second masking signal MASKB2 to a state in which it is disabled to a logic high level, in the case where the reset signal RST is enabled to the logic high level. While, in the present embodiment, the reset signal RST is set to be enabled to the logic high level, it is to be noted that, depending on an embodiment, the reset signal RST may be set to be enabled to the logic low level. While, in the present embodiment, the second masking signal MASKB2 is set to be enabled to a logic low level, it is to be noted that, depending on an embodiment, the second masking signal MASKB2 may be set to be enabled to the logic high level. The second masking signal generation circuit 332 may generate the second masking signal MASKB2 which is enabled to the logic low level, in the case where the second data DQ2 has a logic high level.

Referring to FIG. 9, the first storage control pulse generation circuit 34 may perform an AND operation. In some embodiments, the first storage control pulse generation circuit 34 may perform an AND operation and a buffering operation. The first storage control pulse generation circuit 34 may include an AND gate AND34. In some embodiments, the first storage control pulse generation circuit 34 may include a NAND gate and an inverter. The AND gate AND34 may receive the mode register write pulse MRWP, the first masking signal MASKB1, and the second masking signal MASKB2; perform an AND logic operation; and output the first storage control pulse SCNTP1. The first storage control pulse generation circuit 34 may generate the first storage control pulse SCNTP1 to a logic high level in the case where the mode register write pulse MRWP is generated to a logic high level with both the first masking signal MASKB1 and the second masking signal MASKB2 disabled to the logic high levels. The first storage control pulse generation circuit 34 may block the generation of the first storage control pulse SCNTP1 in the case where the first masking signal MASKB1 or the second masking signal MASKB2 is enabled to the logic low level.

Referring to FIG. 10, the second storage control pulse generation circuit 35 may perform an AND operation. In some embodiments, the second storage control pulse generation circuit 35 may perform a NAND operation and buffering operation. The second storage control pulse generation circuit 35 may include an AND gate AND35. In some embodiments, the second storage control pulse generation circuit 35 may include a NAND gate and inverter. The AND gate AND35 may receive the mode register write pulse MRWP, the first masking signal MASKB1, and the second masking signal MASKB2; perform an AND logic operation; and output the second storage control pulse SCNTP2. The second storage control pulse generation circuit 35 may generate the second storage control pulse SCNTP2 to a logic high level in the case where the mode register write pulse MRWP is generated to the logic high level with both the first masking signal MASKB1 and the second masking signal MASKB2 disabled to the logic high levels. The second storage control pulse generation circuit 35 may block the generation of the second storage control pulse SCNTP2 in the case where the first masking signal MASKB1 or the second masking signal MASKB2 is enabled to the logic low level.

The mode register control circuit 3 described above with reference to FIGS. 7 to 10 may be applied to a semiconductor system. For example, referring to FIG. 11, a semiconductor system 4 may include a controller 41 and a semiconductor device 42.

The controller 41 may be coupled to the semiconductor device 42 through a command address bus 43 and a data bus 44. The controller 41 may apply a command address CA<1:L> to the semiconductor device 42 through the command address bus 43. The controller 41 may apply first data DQ1 and second data DQ2 to the semiconductor device 42 through the data bus 44.

The semiconductor device 42 may include a first pad part 45, a second pad part 46, a third pad part 47, and a mode register control circuit 48. Each of the first pad part 45, the second pad part 46, and the third pad part 47 may include a plurality of pads. The semiconductor device 42 may be applied with the command address CA<1:L> through the first pad part 45 from the controller 41. The semiconductor device 42 may be applied with the first data DQ1 through the second pad part 46 from the controller 41. The semiconductor device 42 may be applied with the second data DQ2 through the third pad part 47 from the controller 41. The mode register control circuit 48 may receive the command address CA<1:L>, the first data DQ1, and the second data DQ2, and may control a mode register write operation. Since the configuration and operation of the mode register control circuit 48 are described above with reference to FIGS. 7 to 10, detailed descriptions thereof will be omitted herein.

The mode register control circuit 3 in accordance with an embodiment configured as mentioned above may generate the first masking signal MASKB1 and the second masking signal MASKB2 by using the first data DQ1 and the second data DQ2, and may block the first storage control pulse SCNTP1 and the second storage control pulse SCNTP2 from being generated from the mode register write pulse MRWP in the case where the first masking signal MASKB1 or the second masking signal MASKB2 is enabled. In the case where the generation of the first storage control pulse SCNTP1 and the second storage control pulse SCNTP2 is blocked, a mode register write operation in which the information signal OP<1:M> is stored in the first mode register 36 and the second mode register 37 might not be performed. That is to say, in a semiconductor device in accordance with an embodiment, when the mode register write pulse MRWP is generated to perform a mode register write operation, it may be possible to easily control whether to perform the mode register write operation, by the first data DQ1 and the second data DQ2. In the case where a semiconductor system to which the mode register control circuit 3 in accordance with an embodiment is applied includes a plurality of semiconductor devices, it may be possible to control whether to perform a mode register write operation in each of the semiconductor devices, depending on a plurality of data, whereby the mode register write operation may be performed at an optimal timing in each semiconductor device.

The semiconductor system 2 described above with reference to FIG. 6 and the semiconductor system 4 described above with reference to FIG. 11 may be applied to an electronic system which includes a memory system, a graphic system, a computing system, a mobile system, etc. For example, referring to FIG. 12, an electronic system 1000 in accordance with an embodiment may include a data storage unit 1001, a memory controller 1002, a buffer memory 1003, and an input/output interface 1004.

The data storage unit 1001 may store data applied from the memory controller 1002, and may read out stored data and output the read-out data to the memory controller 1002, according to control signals from the memory controller 1002. The data storage unit 1001 may include the semiconductor device 22 shown in FIG. 6 or the semiconductor device 42 shown in FIG. 11. The data storage unit 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), a magnetic random access memory (MRAM), etc.

The memory controller 1002 may decode commands applied through the input/output interface 1004 from an external device (a host), and may control input/output of data with respect to the data storage unit 1001 and the buffer memory 1003 according to the decoding results. While the memory controller 1002 is illustrated as one block in FIG. 12, a controller for controlling the data storage unit 1001 and a controller for controlling the buffer memory 1003, which is a volatile memory, may be independently configured in the memory controller 1002. The memory controller 1002 may include the controller 21 shown in FIG. 6 or the controller 41 shown in FIG. 11.

The buffer memory 1003 may temporarily store data to be processed in the memory controller 1002, that is, data to be inputted and outputted to and from the data storage unit 1001. The buffer memory 1003 may store data applied from the memory controller 1002 according to a control signal. The buffer memory 1003 may read out stored data and output the read-out data to the memory controller 1002. The buffer memory 1003 may include a volatile memory such as a DRAM (dynamic random access memory), a mobile DRAM, and an SRAM (static random access memory).

The input/output interface 1004 may provide a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E (peripheral component interconnect express), SAS (serial attached SCSI), SATA (serial advanced technology attachment), PATA (parallel advanced technology attachment), SCSI, ESDI (enhanced small disk interface), and IDE (integrated drive electronics).

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDRC) card, a memory stick card, a smart media (SM) card, a multimedia card (MMC), an embedded MMC (eMMC), a compact flash (CF) card, etc.

While various embodiments have been described above, it will be understood to those skilled in the art that the embodiments described are by way of example only. Accordingly, the semiconductor system including a mode register control circuit described herein should not be limited based on the described embodiments.

What is claimed is:

1. A mode register control circuit comprising:
    a masking signal generation circuit configured to generate a masking signal from data; and
    a storage control pulse generation circuit configured to generate a storage control pulse for controlling a mode register write operation, from a mode register write pulse in response to the masking signal.

2. The mode register control circuit according to claim 1, wherein the masking signal is enabled to block generation of the storage control pulse, when the data is inputted at a preset logic level.

3. The mode register control circuit according to claim 1, wherein the masking signal generation circuit comprises:
    an initialization circuit configured to initialize a first node through which the data is inputted, in response to a reset signal; and
    a latch circuit configured to latch a signal of the first node and output a signal to a second node.

4. The mode register control circuit according to claim 1, wherein the storage control pulse generation circuit buffers the mode register write pulse when the masking signal is disabled, and outputs the storage control pulse.

5. The mode register control circuit according to claim 1, wherein the mode register write pulse is generated for the mode register write operation.

6. The mode register control circuit according to claim 1, further comprising:
    a mode register configured to store an information signal when the storage control pulse is generated.

7. The mode register control circuit according to claim 6, wherein the information signal comprises information on a latency or a burst length, and is extracted from a command address.

8. A semiconductor system comprising:
    a controller configured to output data through a data bus, and output a command address through a command address bus; and
    a semiconductor device configured to generate a masking signal from the data inputted through the data bus, and configured to generate a storage control pulse for controlling a mode register write operation, from a mode register write pulse in response to the masking signal.

9. The semiconductor system according to claim 8, wherein the semiconductor device comprises:
    a first pad part through which the command address is applied; and
    a second pad part through which the data is applied.

10. The semiconductor system according to claim 8, wherein the semiconductor device comprises:
    a masking signal generation circuit configured to generate the masking signal which is enabled to block generation of the storage control pulse, when the data is inputted at a preset logic level.

11. The semiconductor system according to claim 10, wherein the masking signal generation circuit comprises:
    an initialization circuit configured to initialize a first node through which the data is inputted, in response to a reset signal; and
    a latch circuit configured to latch a signal of the first node and output a signal to a second node.

12. The semiconductor system according to claim 8, wherein the semiconductor device comprises:
    a storage control pulse generation circuit configured to buffer the mode register write pulse when the masking signal is disabled, and output the storage control pulse.

13. The semiconductor system according to claim 12, wherein the mode register write pulse is generated for the mode register write operation.

14. The semiconductor system according to claim 8, wherein the semiconductor device comprises:
    a mode register configured to store an information signal when the storage control pulse is generated.

15. The semiconductor system according to claim 14, wherein the information signal comprises information on a latency or a burst length, and is extracted from the command address.

16. A mode register control circuit comprising:
    a masking signal generation circuit configured to generate a first masking signal from first data, and generate a second masking signal from second data;
    a first storage control pulse generation circuit configured to generate a first storage control pulse for controlling a mode register write operation, from a mode register write pulse in response to the first and second masking signals; and
    a second storage control pulse generation circuit configured to generate a second storage control pulse for controlling the mode register write operation, from the mode register write pulse in response to the first and second masking signals.

17. The mode register control circuit according to claim 16,
    wherein the first masking signal is enabled to block generation of the first and second storage control pulses based on the first data, and
    wherein the second masking signal is enabled to block generation of the first and second storage control pulses based on the second data.

18. The mode register control circuit according to claim 16, wherein the first storage control pulse generation circuit generates the first storage control pulse from the mode register write pulse when the first and second masking signals are disabled.

19. The mode register control circuit according to claim 16, further comprising:
    a first mode register configured to store an information signal when the first storage control pulse is generated.

20. The mode register control circuit according to claim 19, wherein the information signal comprises information on a latency or a burst length, and is extracted from a command address.

* * * * *